(12) United States Patent
Harel

(10) Patent No.: US 8,543,880 B2
(45) Date of Patent: Sep. 24, 2013

(54) TECHNIQUES FOR SUCCESSIVE REFINEMENT OF METRICS STORED FOR HARQ COMBINING

(75) Inventor: Tom Harel, Shfaim (IL)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 12/884,437

(22) Filed: Sep. 17, 2010

(65) Prior Publication Data

US 2012/0072800 A1    Mar. 22, 2012

(51) Int. Cl.
*H04L 1/18* (2006.01)
(52) U.S. Cl.
USPC ............................ 714/751; 714/749; 714/774
(58) Field of Classification Search
USPC ................... 714/751, 749, 748, 774
See application file for complete search history.

(56) References Cited

U.S. PATENT DOCUMENTS

| 7,810,009 | B2 * | 10/2010 | Kwon et al. | 714/749 |
|---|---|---|---|---|
| 7,823,040 | B2 * | 10/2010 | Cheng | 714/751 |
| 8,085,786 | B2 * | 12/2011 | Tsai et al. | 370/395.42 |
| 2005/0166129 | A1 | 7/2005 | Yano et al. | |
| 2007/0189231 | A1 | 8/2007 | Chang et al. | |
| 2008/0065944 | A1 | 3/2008 | Seol et al. | |
| 2009/0003301 | A1 * | 1/2009 | Reial et al. | 370/342 |
| 2009/0158110 | A1 | 6/2009 | Park et al. | |
| 2010/0296389 | A1 * | 11/2010 | Khandekar et al. | 370/216 |

FOREIGN PATENT DOCUMENTS

| KR | 20090036667 A | 4/2009 |
|---|---|---|
| WO | 2012036955 A1 | 3/2012 |

OTHER PUBLICATIONS

International Search Report and Written Opinion received for PCT application No. PCT/US2011/050702, mailed on Feb. 9, 2012, 11 Pages.
International Preliminary Report on Patentability received for PCT Patent Application No. PCT /US2011/050702, mailed on Mar. 28, 2013, 9 pages.

* cited by examiner

*Primary Examiner* — Fritz Alphonse
(74) *Attorney, Agent, or Firm* — Thorpe North & Western, LLP

(57) ABSTRACT

An embodiment of the present invention provides a method of efficiently storing metrics for Hybrid Automatic Retransmission Request (HARQ) combining and enabling saving of memory buffer in communication systems, comprising using non-linear quantization of the metrics and managing an aggregated buffer for all HARQ channels.

26 Claims, 2 Drawing Sheets

TECHNIQUES FOR SUCCESSIVE REFINEMENT OF METRICS STORED FOR HARQ COMBINING

BACKGROUND

Wireless networks are now pervasive and vital in society. Wireless networks may transmit and receive information utilizing varying techniques. Hybrid Automatic Retransmission Request (HARQ) improves the spectral efficiency of communication systems like 4G technologies WiMAX and LTE, although the present invention is not limited to these particular wireless communication technologies. Receiver implementation of HARQ requires a large amount of memory, since it requires storage of received information in the form of soft bits. A Soft Bit, also referred to herein as a bit's metric, represents the reliability of the received bit, and usually is evaluated as LLR (Log Likelihood Ratio) for this bit.

Currently, metrics in a HARQ buffer are saved with 8 or 6 bits per metric and successfully decoded FEC blocks are not evacuated from the buffer. Consequently, there is a strong need in the wireless communication industry to refine metrics saved in a HARQ buffer in order to take advantage of the typical buffer occupancy and to work in conjunction with efficient representation of the metrics and efficient management of an aggregated buffer.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
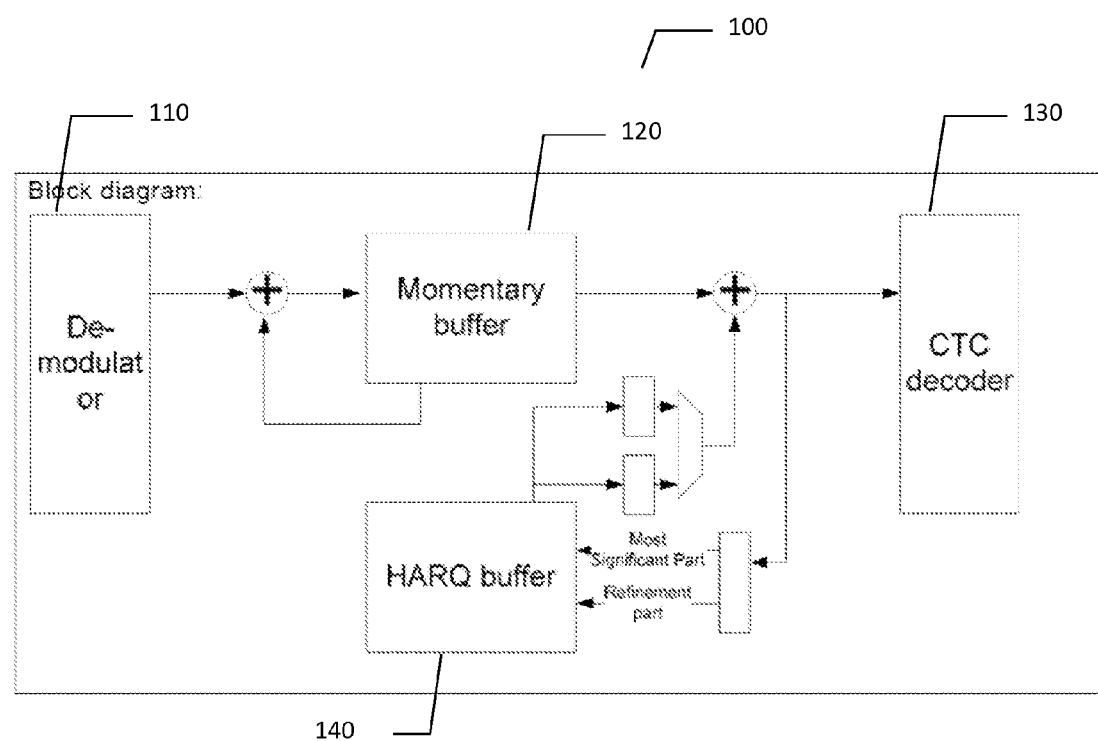
FIG. 1 illustrates a block diagram according to embodiments of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the preset invention may be practiced without these specific details. In other instances, well-known methods, procedures, components and circuits have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations.

Embodiments of the present invention provide refining metrics saved in a HARQ buffer in order to take advantage of the typical buffer occupancy and to work in conjunction with efficient representation of the metrics and efficient management of an aggregated buffer. Embodiments of the present invention further provide successive refinement, a common scale factor, odd number of quantization levels, and evacuation from memory of successfully decoded FEC blocks.

Embodiments of the present invention may be described herein for use in a Down-Link receiver, such as, but not limited to, a Mobile Station (MS) implementation. However, it can also be applied in the case of Up-Links in a similar fashion. In the downstream or downlink case, the generically-named transmitters may be interchangeably referred to as a base station (BS) or enhanced Node B (eNB) or access point (AP) at the system level herein. In this downlink case, the receivers above may be interchangeably referred to as a mobile station (MS) or subscriber station (SS) or user equipment (UE) or station (STA) at the system level herein. Further, the terms BS, eNB, and AP may be conceptually interchanged, depending on which wireless protocol is being used, so a reference to BS herein may also be seen as a reference to either of eNB or AP. Similarly, a reference to MS or SS herein may also be seen as a reference to either of UE or STA.

In order to completely avoid the possibility of buffer overflow, the throughput (in bits per second) is limited by the HARQ buffer size and the Round-Trip-Time (RTT) according to:

$$Throughput \leq \frac{BufferSize \times R}{RTT}$$

Where BufferSize is the number of soft-bits the MS is capable storing, R is the transmission code rate and RTT is the (minimal) Round-Trip-Time in seconds. Traditional HARQ protocols, like those used in 802.16e and LTE (although not limited to these protocols), limit the maximal throughput according to this equation. This is a worst case constraint: most of the HARQ buffer is typically unused, even in the case of maximal throughput transmission, since the entire buffer is needed only if all of the information within the RTT fails to be received. 802.16m takes a different approach where the scheduler at the Base Station (BS) does not limit the throughput to the MS according to its declared buffer size, but can over-utilize the buffer with the risk of rare overflows. For reference, the LTE buffer size is 1.8 M soft-bits for UE category-4 devices, and 3.7 M soft-bits for UE category 5-devices. Traditional implementations use 8 bits per metric, which results in buffer size of 1.8 MByte for category-4 devices. This memory is very costly if implemented as internal on-die SRAM, while using off-die DRAM requires high throughput towards the memory.

Thus, embodiments of the present invention reduce the number of bits used to save each metric (soft bit). Utilizing the present invention one may only need 2.5 bits per metric, such that the required memory size for LTE category-4 is 1.8 M*2.5/8=571 KByte. Turning now to FIG. 1, shown generally as 100, is a block diagram according to embodiments of the present invention and include Demodulator 110, momentary buffer 120, CTC decoder 130 and HARQ buffer 140.

The efficient storage of metrics in HARQ buffer 140 is provided herein by using:

1. Non-linear quantization of the metrics 2.
2. Separation of metrics representation in HARQ buffer from the decoding of current transmission
3. Management of an aggregated buffer for all HARQ channels
4. Release successfully decoded FEC blocks from memory buffer, saving only the decoded (hard decision) bits.
5. Successive refinement of the metrics in HARQ buffer.
6. Use a common scale factor for a group of metrics representing their "average" magnitude.
7. Use odd number of quantization levels per metric, and group a few metrics for an efficient representation Non-linear quantization of the metrics is a well-known method for representation of metrics when coping with fading channel, plurality of code rates, high order modulations (like 64-QAM) and uncertainty of noise level. A common practice is to uniformly quantize the log of the metric (which by itself is an LLR) instead of the metric itself.

Separation of metrics representations in a HARQ buffer from the decoding of current transmission provides that the performance requirement for the first transmission is tighter than that for re-transmission. A small loss in HARQ retransmission causes negligible loss in the overall spectral efficiency (or probability of error) since: (1) The probability of retransmission is low, typically lower than 30%; (2) When non-adaptive HARQ is used, the required SNR for successful decoding of a re-transmission is significantly lower than that for original transmission so the loss is tolerable; (3) Even with adaptive HARQ, since the overall latency must be limited the error probability in the re-transmission must be low enough. Therefore, more accurate metrics representation is required for original transmission than for re-transmission, and metrics stored in the large HARQ buffer can be more efficiently represented on the expense of small performance loss.

Management of an aggregated buffer for all HARQ channels may be incorporated into embodiments of the present invention. Typically, HARQ is managed as N-channels stop-and-wait protocol. Naïve implementation uses a separate buffer for each HARQ channel. By using buffer aggregation in embodiments herein (i.e. a common buffer for all HARQ channels), a better utilization of the buffer is achieved; since typically errors in different channels are not fully correlated, and usually the aggregated buffer is not fully occupied, even if some channels require full storage.

Embodiments of the present invention may release successfully decoded FEC blocks from memory buffer, saving only the decoded (hard decision) bits. For example, but not by way of limitation, 802.16m and LTE add CRC to each FEC block, which allows identification of successful decoding of each FEC block even when the decoding of the entire burst fails. In the absence of CRC per FEC block, successful decoding can be identified by checking the convergence of the CTC decoder.

Since the required memory size for soft bits is larger than for the hard decision decoded bits by factor bpm/R (where bpm denotes the number of bits per metric, and R is the code rate), this enables significant saving in buffer usage.

Figure 2:
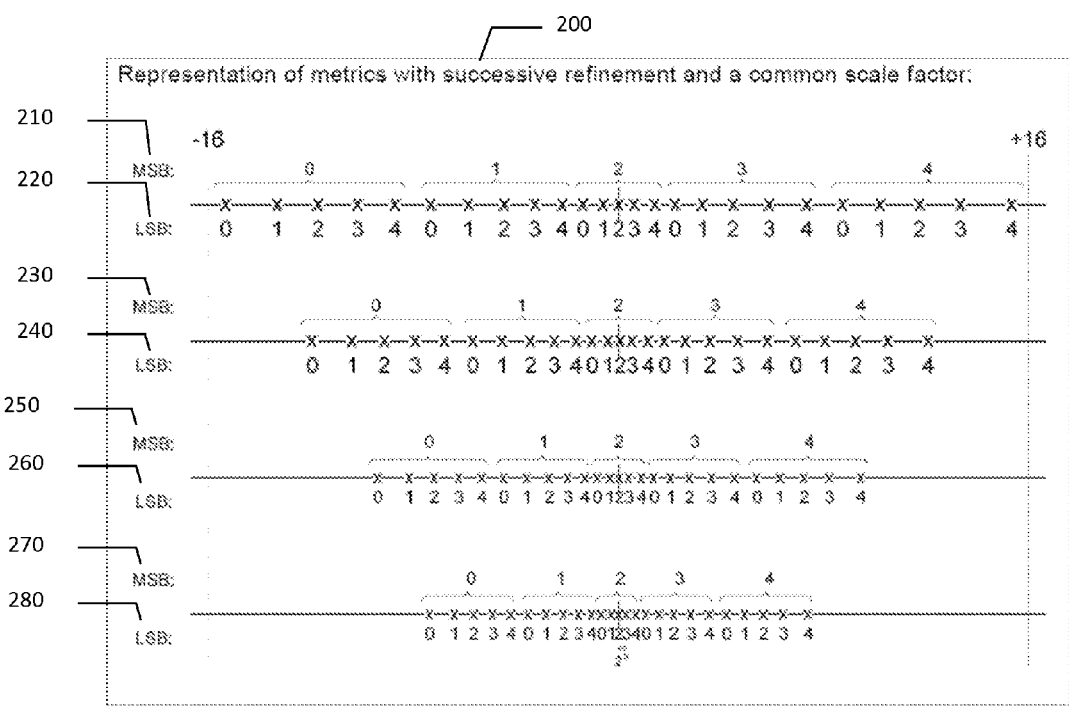
FIG. 2 provides a representation of metrics with successive refinement and a common scale factor according to embodiments of the present invention.

As shown in FIG. 2 as 200, embodiments of the present invention may successively refine the metrics in a HARQ buffer. The HARQ buffer should allow storage of large number of metrics, while in almost all practical scenarios most of it is unused. This suggests using variable metrics representation, where a less efficient representation is used when the buffer occupancy is low and a more efficient representation (compressed, with some performance loss) when the buffer occupancy is high. Combined with aggregated buffer management and the release of successfully decoded FEC blocks, the probability of high buffer occupancy is low, and as such the small performance degradation is tolerable.

Embodiments of the present invention provide implementing the variable representation by successive refinement of the metrics (i.e., separate the metric representation to parts) where the first part contains the most important information (like "Most Significant Bits") 210, 230, 250 and 270 and the second part contains additional information to refine the first part ("Least Significant Bits") 220, 240, 260 and 280. This enables storing the two parts as long as the buffer is not fully occupied, and when required to store additional metrics, override the Least-Significant part of already stored metrics by a Most-Significant part of new metrics.

Assuming the two parts have equal size, we have full performance guarantee when buffer occupancy is up to 1/2 of the maximal number of soft bits, and a small implementation loss only when exceeding this level. Furthermore, when exceeding this threshold and replacing Least-Significant parts by new Most-Significant parts, it is possible to select which metrics to override such that the loss is minimized.

Some embodiments of the present invention may use a common scale factor for a group of metrics representing their "average" magnitude. Under regular conditions 3 to 4 bits per metric should suffice for good decoder performance. However, there are some reasons why practical systems usually require more bits per metric:

1. Fading channel and high order QAM;
2. Variety of code rates, between ~1/12 (rate 1/2 repetition 6) and ~5/6;
3. HARQ changes the code rate in each re-transmission; and
4. The noise and interference levels are not known accurately, and therefore the metrics are wrongly scaled.

Because of the reasons above, higher dynamic range is required for the metrics' representation. However, most of these reasons are common to large groups of metrics in the buffer. Therefore, we can represent a group of metrics by a common scale factor according to their "average" magnitude and then to quantize them to less bits. Another way to look at it is that when there are large metrics the small metrics are of less importance, so the quantization levels should be adapted to the relatively large metrics in the group.

Some embodiments of the present invention may further use odd number of quantization levels per metric, and group a few metrics for an efficient representation. Desired properties from the quantization levels are to include the zero metric and to be symmetric around zero. Therefore, an odd number of quantization levels are needed. For example, using 3 bits per metric allows 7 quantization levels and causes a waste of $Log_2(8/7)=0.2$ bits. A more sophisticated representation may save several metrics together. Saving 3 metrics together, where each of them has 5 quantization levels, require $5^3=125$ levels that can be saved with 7 bits, wasting only $Log_2(128/125)=0.03$ bits.

Yet another embodiment of the present invention provides a wireless communication system, comprising a base station (BS), and a mobile station (MS) operable to communicate with the BS in the wireless communication system and capable of efficiently storing metrics for Hybrid Automatic Retransmission Request (HARQ) combining and enabling saving of memory buffer by using non-linear quantization of the metrics, managing an aggregated buffer for all HARQ channels, and successively refining metrics in the HARQ buffer.

Yet another embodiment of the present invention may provides a computer readable medium encoded with computer executable instructions, which when accessed, cause a machine to perform operations comprising, efficiently storing metrics for Hybrid Automatic Retransmission Request (HARQ) combining and enabling saving of memory buffer in communication systems by using non-linear quantization of the metrics, managing an aggregated buffer for all HARQ channels, and successively refining metrics in the HARQ buffer.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

I claim:

1. A method of quantizing metrics for Hybrid Automatic Retransmission Request (HARQ) combining and managing of a memory buffer in communication systems, comprising:
   using a Down-Link receiver to non-linearly quantize said metrics; and
   managing an aggregated buffer for all HARQ channels.

2. The method of claim 1, further comprising successively refining metrics in said HARQ buffer.

3. The method of claim 1, further comprising separating metrics representations in said HARQ buffer from a decoding of a current transmission.

4. The method of claim 1, further comprising releasing successfully decoded forward error correction (FEC) blocks from memory buffer and saving only decoded bits.

5. The method of claim 1, further comprising using a common scale factor for a group of metrics representing their average magnitude.

6. The method of claim 1, further comprising using an odd number of quantization levels per metric and grouping metrics for an efficient representation.

7. A non-transitory computer readable medium encoded with computer executable instructions, which when accessed, cause a machine to perform operations comprising: efficiently storing metrics for Hybrid Automatic Retransmission Request (HARQ) combining and enabling saving of memory buffer in communication systems by using non-linear quantization of said metrics and managing an aggregated buffer for all HARQ channels.

8. A non-transitory computer readable medium encoded with computer executable instructions of claim 7, further comprising successively refining metrics in said HARQ buffer.

9. A non-transitory computer readable medium encoded with computer executable instructions of claim 7, further comprising separating metrics representations in said HARQ buffer from a decoding of a current transmission.

10. A non-transitory computer readable medium encoded with computer executable instructions of claim 7, further comprising releasing successfully decoded forward error correction (FEC) blocks from memory buffer and saving only decoded bits.

11. A non-transitory computer readable medium encoded with computer executable instructions of claim 7, further comprising using a common scale factor for a group of metrics representing their average magnitude.

12. A non-transitory computer readable medium encoded with computer executable instructions of claim 7, further comprising using an odd number of quantization levels per metric and group metrics for an efficient representation.

13. An apparatus, comprising:
    a mobile station (MS) operable for communication in a wireless network and capable of efficiently storing metrics for Hybrid Automatic Retransmission Request (HARQ) combining and enabling saving of memory buffer by using non-linear quantization of said metrics and managing an aggregated buffer for all HARQ channels.

14. The apparatus of claim 13, wherein said MS is further capable of successively refining metrics in said HARQ buffer.

15. The apparatus of claim 13, wherein said MS is further capable of separating metrics representations in said HARQ buffer from a decoding of a current transmission.

16. The apparatus of claim 13, wherein said MS is further capable of releasing successfully decoded forward error correction (FEC) blocks from memory buffer and saving only decoded bits.

17. The apparatus of claim 13, wherein said MS is further capable of using a common scale factor for a group of metrics representing their average magnitude.

18. The apparatus of claim 13, wherein said MS is further capable of using an odd number of quantization levels per metric and group metrics for an efficient representation.

19. A wireless communication system, comprising:
    a base station (BS); and
    a mobile station (MS) operable to communicate with said BS in said wireless communication system and capable of efficiently storing metrics for Hybrid Automatic Retransmission Request (HARQ) combining and enabling saving of memory buffer by using non-linear quantization of said metrics and managing an aggregated buffer for all HARQ channels.

20. The wireless communication system of claim 19, wherein said MS is further capable of successively refining metrics in said HARQ buffer.

21. The wireless communication system of claim 19, wherein said MS is further capable of separating metrics representations in said HARQ buffer from a decoding of a current transmission.

22. The wireless communication system of claim 19, wherein said MS is further capable of releasing successfully decoded forward error correction (FEC) blocks from memory buffer and saving only decoded bits.

23. The wireless communication system of claim 19, wherein said MS is further capable of using a common scale factor for a group of metrics representing their average magnitude.

24. The wireless communication system of claim 19, wherein said MS is further capable of using an odd number of quantization levels per metric and group metrics for an efficient representation.

25. The wireless communication system of claim 19, wherein said communication system operates conforming to the Institute for Electronic and Electrical Engineers (IEEE) 802.16m standard.

26. The wireless communication system. of claim 19, wherein said communication system operates conforming to the 3GPP Long Term Evolution (LTE) standard.

* * * * *